United States Patent [19]

Fuller

[11] Patent Number: 4,678,274
[45] Date of Patent: Jul. 7, 1987

[54] LOW LOSS CLADDED OPTICAL FIBERS FROM HALIDES AND PROCESS FOR MAKING SAME

[75] Inventor: Terry A. Fuller, West Bloomfield, Mich.

[73] Assignee: Fuller Research Corporation, West Bloomfield, Mich.

[21] Appl. No.: 565,569

[22] Filed: Dec. 27, 1983

[51] Int. Cl.[4] ............................................. G02B 6/16
[52] U.S. Cl. ................................ 350/96.34; 264/1.5; 350/96.23; 350/96.30
[58] Field of Search ............... 350/96.30, 96.31, 96.33, 350/96.34, 96.23; 264/1.5

[56] References Cited

U.S. PATENT DOCUMENTS

| | | | |
|---|---|---|---|
| 4,098,926 | 7/1978 | Nöthe | 264/1.5 X |
| 4,253,731 | 3/1981 | Anderson et al. | 350/96.34 |
| 4,302,073 | 11/1981 | Bendayan et al. | 350/96.23 |
| 4,311,726 | 1/1982 | Hacker et al. | 350/96.34 X |
| 4,315,667 | 2/1982 | Nakagome et al. | 350/96.34 |
| 4,381,141 | 4/1983 | Sakuragi et al. | 350/96.34 |
| 4,490,008 | 12/1984 | Murakami et al. | 350/96.34 |
| 4,521,073 | 6/1985 | Murakami et al. | 350/96.34 |
| 4,552,434 | 11/1985 | Murakami et al. | 350/96.30 |
| 4,583,821 | 4/1986 | Murakami et al. | 350/96.34 |

FOREIGN PATENT DOCUMENTS

| | | | |
|---|---|---|---|
| 56-104302 | 8/1981 | Japan | 350/96.34 |
| 56-104304 | 8/1981 | Japan | 350/96.34 |
| 58-91405 | 5/1983 | Japan | 264/1.5 |

OTHER PUBLICATIONS

D. Chen, R. Skogman, G. E. Bernal and C. Butter, "Fabrication of Silver Halide Fibers by Extrusion", Fiber Optics: Advances in Research and Development, edited by B. Bendow and S. S. Mitra, Plenum, New York, 1977.
D. A. Pinnow, A. L. Gentile, A. G. Stardlee, A. J. Timper, and L. M. Holbrock, "Polycrystalline Fiber Optical Waveguides for Infrared Transmission", Applied Physics Letters, vol. 33, pp. 28–29 (1978).
J. A. Garfunkel, R. A. Skogman, and R. A. Walterson, "Infrared Transmitting Fibers of Polycrystalline Silver Halides", 1979 IEEF/OSA Conference on Laser Engineering and Applied Digest of Technology, Paper 8.1.
J. A. Harrington, M. Braunstein, B. Bobbs and R. Braunstein, "Scattering Losses in Single and Polycrystalline Infared Material for Infrared Fiber Applications", Adv. in Ceramics, vol. 2, pp. 94–103 (1981).
Sakuragi, S., Saito, M., Kubo, Y., Imagawa, K., Kotani, H., Morikawa, T., Shinada, J., "KRS-5 Optical Fibers Capable of Transmitting High-power $CO_2$ Laser Beam", Opt. Lett., vol. 6 (Dec. 1981).
Sakuragi, S., "Polycrystalline KRS-5 Infrared Fibers for Power Transmission", Research Report, Agency of Industrial Science and Technology, Ministry of Int. Trade and Industry, Japan, 320-02, 1981.
Sakuragi, S., Imagawa, K., Satto, M., Kotani, H., Morikawa, T., Shimada, J., "Infrared Transmission Capabilities of Thallium Halide and Silver Halide Optical Fibers", Adv. in Ceramics, vol. 2, pp. 84–93 (1981).
J. A. Harrington, "Crystalline Infrared Fibers".

*Primary Examiner*—John Lee
*Attorney, Agent, or Firm*—Seidel, Gonda, Goldhammer & Abbott

[57] ABSTRACT

A low loss cladded halide fiber for transmission of infrared energy is provided, and a process for making the same by growing a single crystal ingot from a powder of a core halide, extruding or machining the ingot to provide a cylindrical billet core, assembling the billet core, preferably wrapped in a polymer film, within a sleeve member of a second halide of lower refractive index than the core, prepared in the same fashion as the core, and coaxially core drilled to accept the billet core. The assembled composite billet is covered with a polymer film, heated, and extruded to form a polymer coated fiber having a diameter in the range of 75 to 2,000 microns. The extruded fiber may be rapidly cooled as it leaves the extrusion die to minimize grain size and scattering loss and may be contained in a coaxial outer strength member.

53 Claims, 9 Drawing Figures

LOW LOSS CLADDED OPTICAL FIBERS FROM HALIDES AND PROCESS FOR MAKING SAME

BACKGROUND OF THE INVENTION

1. Field of the Invention

The present invention relates to cladded optical fibers for transmission of electromagnetic energy in the infrared region having a protectice coating and to a method for manufacture of such fibers.

2. Description of the Prior Art

There has been great interest in the past few years in optical fibers capable of conducting infrared (IR) energy. The most promising materials are polycrystalline infrared fibers which have been found to be useful as optical waveguides. The most common materials investigated in the prior art are thallium bromo-iodide (TlBrI, known as KRS-5), thallium bromide (TlBr), silver chloride (AgCl), potassium bromide (KBr), and potassium chloride (KCl).

The most common application of waveguides formed from these materials is in conjunction with $CO_2$ lasers with the fibers used to deliver the 10.6 $\mu$m laser energy to remote or otherwise inaccessible locations for heating or for machining. The IR waveguides are also useful for transmitting infrared energy in pyrometry or spectroscopy from a source of heat to remote heat sensitive detectors. There is also considerable interest in using such fibers for long distance communications as an alternative to the more commonly used silica fibers.

Perhaps the most promising and useful application of polycrystalline IR fiber waveguides is in surgical procedures. Through the use of very small diameter fibers, from about 75 micrometers ($\mu$m) to 1 or 2 millimeters (mm), laser energy may be transmitted into arteries, veins, joints, the eye, and other parts of the body. All living tissues strongly absorb the 10.6 $\mu$m energy from the carbon dioxide laser due to the high absorption of the water contained in the tissue and therefore there is great potential for cutting with limited hemostasis and for tissue ablation. Current practical techniques of $CO_2$ laser energy delivery are limited to direct line of sight or by reflections from mirrors or prisms.

Most infrared fiber waveguides have been produced from a billet or preform of the bulk crystal material. The preform is heated and extruded through a suitable die to obtain the fibers. This process results in a polycrystalline form having a grain size which is a function of the temperature, rate of extrusion, and other factors. Both the physical and optical properties of the fibers differ among the materials.

Of particular importance is the optical properties of the infrared fibers with respect to the losses therein. Most of the above listed materials have extremely low theoretical losses but the losses actually achieved have generally been much higher than theoretical. In the extruded fibers, scattering due to surface conditions, grain structure and multiphonon absorption appear to be responsible for most of the losses. It is therefore possible to improve the actual losses to approach the theoretical losses by minimizing the scattering loss through improvement of surface quality, reduction of the crystalline grain size, and use of purer starting materials.

The state of the prior art in infrared optical fibers is believed to be defined by the following references:

1. D. Chen, R. SKogman, G. E. Bernal and C. Butter, "Fabrication of Silver Halide Fibers by Extrusion", Fiber Optics: Advances in Research and Development, edited by B. Bendow and S. S. Mitra, Plenum, New York, 1977.

2. D. A. Pinnow, A. L. Gentile, A. G. Stardlee, A. J. Timper, and L. M. Holbrock, "Polycrystalline Fiber Optical Waveguides for Infrared Transmission", Applied Physics Letters, Vol. 33, pp 28-29 (1978).

3. J. A. Garfunkel, R. A. Skogman, and R. A. Walterson, "Infrared Transmitting Fibers of Polycrystalline Silver Halides", 1979 IEEE/OSA Conference on Laser Engineering and Applied Digest of Technology, Paper 8.1.

4. J. A. Harrington, M. Braunstein, B. Bobbs and R. Braunstein, "Scattering Losses in Single and Polycrystalline Infrared Material for Infrared Fiber Applications", Adv. in Ceramics, Vol. 2, pp 94-103 (1981).

5. Sakuragi, S., Saito, M., Kubo, Y., Imagawa, K., Kotani, H., Morikawa, T., Shinada, J., "KRS-5 Optical Fibers Capable of Transmitting High-power $CO_2$ Laser Beam", Opt. Lett., Vol. 6 (December 1981).

6. Sakuragi, S. "Polycrystalline KRS-5 Infrared Fibers for Power Transmission". Research Report, Agency of Industrial Science and Technology, Ministry of Int. Trade and Industry, Japan, 320-02, 1981.

7. Sakuragi, S., Imagawa, K., Saito, M., Kotani, H., Morikawa, T., Shimada, J., "Infrared Transmission Capabilities of Thallium Halide and Silver Halide Optical Fibers", Adv. in Ceramics, Vol. 2, pp 84-93 (1981).

8. J. A. Harrington, "Crystalline Infrared Fibers".

9. Bendayan, et al, U.S. Pat. No. 4,302,073.

10. Anderson, et al, U.S. Pat. No. 4,253,731.

Chen, in reference 1 above, reports fabricating silver halide (AgCl and AgBr) fibers which were extruded in diameters of 3 to 18 mil at the rate of 0.2 to 25 inches per minute at temperatures from 20° to 300° C. To obtain fine grain size, low extrusion rates and low temperatures were used. Single crystals were used for extrusion. An absorption coefficient of $5 \times 10^{-3}$ cm$^{-1}$ was measured. Garfunkel (ref. 3) reported that fibers extruded from AgCl and AgBr could be obtained having a fine grained structure initially, but that grain growth occurred rapidly after extrusion. Garfunkel also extruded potassium chloride (KCl) fibers which were hygroscopic and were found to be quite brittle at room temperature. No physical or optical characteristics were reported. The Pinnow paper (ref. 2) discusses extruded fibers of thallium bromide (TlBr) and thallium bromo-iodide (TlBrI, known commerically as KRS-5) which have a polycrystalline form. These were prepared from diameters in the range of 75 to 500 microns and were extruded at temperatures in the range of 200° to 350° C. at rates of several centimeters per minute. The crystaline fibers were inserted into a loose-filling polymer cladding to provide optical confinement and mechanical protection.

Harrington (ref. 4) studied the scattering losses in single crystal and polycrystalline KCl and KRS-5. At IR wavelengths, the scattering and multiphonon absorption mechanisms were identified as the limiting loss processes. The polycrystalline materials were found to scatter more strongly than the single crystal materials. In reference 8, Harrington reported on efforts to improve losses in IR transmissive crystalline materials including KRS-5, TlBr, AgCl, KBr, and KCl. He notes that the silver and thallium halides have high refraction indices which can present problems in finding suitable cladding for single mode operation, while the alkali halides have reasonable refractive indices but are hygroscopic and have high melting points. The measured losses in IR fibers are very much higher than intrinsic values. A table of losses is provided for 10.6 microns (the wavelength of a $CO_2$ laser energy) comparing intrinsic values, bulk material values and fiber material values of the absorption coefficient and the attenuation per meter, as follows:

|       | INTRINSIC | EXPERIMENTAL BULK | FIBER |
|-------|-----------|-------------------|-------|
| KRS-5 | $1 \times 10^{-6}$ cm$^{-1}$ $4.4 \times 10^{-4}$ dB/m | $7 \times 10^{-4}$ cm$^{-1}$ 0.3 dB/m | $9 \times 10^{-4}$ cm$^{-1}$ 0.4 dB/m |
| TlBr  | $1 \times 10^{-6}$ cm$^{-1}$ $4.4 \times 10^{-4}$ dB/m | $1 \times 10^{-3}$ cm$^{-1}$ 0.43 dB/m | $1 \times 10^{-3}$ cm$^{-1}$ 0.43 dB/m |
| AgCl  | $5 \times 10^{-5}$ cm$^{-1}$ .022 dB/m | $5 \times 10^{-3}$ cm$^{-1}$ 2.18 dB/m | $9 \times 10^{-3}$ cm$^{-1}$ 4.0 dB/m |
| KBr   | $1 \times 10^{-6}$ cm$^{-1}$ $4.4 \times 10^{-6}$ dB/m | $1 \times 10^{-5}$ cm$^{-1}$ | — |
| KCl   | $8 \times 10^{-5}$ cm$^{-1}$ .035 dB/m | $8 \times 10^{-5}$ cm$^{-1}$ 0.034 dB/m | $1 \times 10^{-2}$ cm$^{-1}$ 4.2 dB/m |

The thallium halides have produced fibers with losses close to the bulk values, but poor results have been obtained for KCl fibers. Power densities in a one meter KRS-5 fiber from 2.5 kW/cm$^2$ to 6.1 KW/cm$^2$ were reported. Harrington found that extrusion of KCl produced a poor surface quality resulting from friction between the KCl and the extrusion die and therefore abandoned attempts to extrude this material.

Sakuragi and others have experimented with IR fibers for conducting the output of $CO_2$ lasers (10.6 μm energy) at high power level. As reported in references 5–7, these workers concluded that a mixed halide fiber such as KRS-5 is superior to the pure halides such as AgCl. An extinction coefficient less than $10^{-2}$ cm$^{-1}$ could not be obtained for AgCl. They concluded that KRS-5 was a superior material, mechanically, optically and chemically. To reduce losses it is required to minimize anion impurities such as $SO_4^{2-}$, $NO_3^-$ and $HCO_3^-$. Also, a good surface finish is necesary to minimize inclusions, cracks and scratches which increase scattering losses and decrease the power damage threshold. For example, reference 5 reported that extrusion of KRS-5 through a diamond wire die resulted in 1-2 micron deep scratches on the fiber surface from microscopic dust in the die.

These papers report transmission losses of 0.4 to 0.6 dB/m and extinction coefficients of $1.5 \times 10^{-3}$ cm$^{-1}$ to $9 \times 10^{-4}$ cm$^{-1}$ although bulk KRS-5 was measured at $4 \times 10^{-4}$ cm$^{-1}$, somewhat lower than the value reported by Harrington. Although some of the increase in loss of the extruded fibers is due to scattering loss at the polycrystalline boundaries, it is predicted that the fiber loss can approach the bulk value by reduction of impurities, defects and grain size.

The maximum power density reported is 36 kW/cm$^2$. Optical degradation can occur from mechanical deformation of the fibers. A minimum ending radius of 12 cm was noted for a 1 mm diameter KRS-5 fiber. Sakuragi describes a surgical probe using the 1 mm KRS-5 fiber. The fiber was covered by a loose-fitting polymer tube for protection.

Commercial KRS-5 fiber products have required bulky protective coatings to protect the fiber, as well as to protect the environment from the toxic KRS-5. This packaging drastically reduces the utility of the fiber by restricting its use to external or open body cavity procedures only. This is due to the inability of such large, flexible devices to be used in conjunction with an endoscope. Horiba, Inc. (Japan) formerly offered a KRS-5 fiber having an outer jacket of 10 mm diameter protecting a 1 mm fiber optic.

As may be understood from the above references, IR fibres have various critical problems that must be addressed in producing practical devices. The outer surface of the fiber must be highly finished with a minimum of cracks or scratches. Both the alkali halides and thallium halides are hygroscopic. Thus, the fibers require some coating for mechanical protection of the outer surface. Also, a restraint on the minimum bending radius must be provided. To minimize the losses in the fibers, the extrusion process must be such that a very fine grain crystalline structure is realized.

The patent to Bendayan, et al (ref. 9) notes that attempts have been made to extrude a tight fitting plastic covering onto an IR fiber such as taught by Hawkins in U.S. Pat. No. 3,742,107. However, the lateral pressure on the fiber results in microfractures of the fiber surface increasing transmission loss. Bendayan, et al teach the extrusion of a plastic covering over an optical fiber with a clearance of 1 to 10 microns therebetween eliminating the lateral pressure.

Reference 10, the Anderson, et al patent, describes a method of extruding a silver bromide IR fiber core having a silver chloride cladding. A coaxial billet is extruded through a diamond die 6 to 18 ml in diameter. The resulting boundary between fiber core and cladding is rough and poorly defined. See FIG. 4 of Anderson.

As referred to herein "clad" or "cladding" means a coaxial crystalline or polycrystalline layer surrounding a fiber core.

As referred to herein "window" shall mean a window or a lens in an infrared optical cable.

SUMMARY OF THE INVENTION

My invention is a novel process for extruding a cladded optical polycrystalline fiber that meets the requirement for an IR fiber having a fine grain structure, a smooth surface and a protective covering. I also provide a novel IR probe structure for the optical fiber that is applicable to use of the fiber in laser beam surgical procedures, remote heat sensing, pyrometry, spectroscopy and laser beam machining.

The process requires an ingot of the halide. I prefer the use of Merck's Optipur (a trademark of Merck & Co., Inc.) grade powdered material. The powder is first vacuum baked in a quartz ampoule. The material is then melted.

After melting, a single crystal is then grown by the Bridgeman method. I prefer a cylindrical ingot one inch in diameter and four to five inches in length. Larger ingots, 5-6 inches in length, may be used and core-drilled or cut and machined to size.

The above-described process produces a single crystalline ingot with a very low impurity level. A billet core is then prepared by core drilling, machining or extruding the ingot to form a crystal bittlet core having a diameter of 3-6 mm and a length of three to four inches.

Preformed billets of poorer optical quality are commercially available, such as from Harshaw Chenmical Co. However, I prefer to grow my own crystals from Optipur grade powdered halide.

After the billet core is prepared, it is cladded with a compatible material having a lower index of refraction than the waveguiding core portion. The preferred preextrusion radial thickness of the cladding is between about 1 mm and about 3 mm. The billet core may be a cylindrical preform of the desired waveguide halide inserted coaxially in a sleeve member of lower refractive index.

After the composite billet is assembled, it is placed in a thin tube of a non-hygroscopic plastic or other polymer material, such as polyethylene, polyvinyl fluoride, nylon, teflon, cellophane, polyvinylidene chloride (saran) or a similar material which is heat shrunk around the composite billet. Alternatively, the composite billet may simply be wrapped with the polymer material. The preferred radial thickness of polymer is between about 0.03 mm and about 0.09 mm. A heated die block having a cylindrical opening to receive the billet and a suitable die for the desired diameter fiber may be used. The polymer-wrapped billet is inserted in the die block and allowed to come up to a preselected temperature which tends to make the billet and polymer more ductile. A hydraulically or other mechanically operated ram is them inserted in the die block opening in contact with the billet end. Pressure is then applied to the ram forcing the coaxial billet into the die. The softened polymer and halide core and sleeve are extruded into a small halide fiber of between about 0.075 and about 2.0 mm outside diameter, coated with a thin layer of polymer. A stream of nitrogen gas which has been cooled by liquid nitrogen is directed at the coated fiber as it leaves the die, quickly cooling the polymer and the halide fiber. The extrusion process forces the softened polymer into continuous intimate contact with the outer surface of the fiber. The polymer serves several important functions. During the extrusion process, the polymer acts as a lubricant, preventing any contact between the die and the fiber. Therefore, the highly finished surface of the billet is not affected by the die or the extrusion process. The continuous intimate polymer coating on the final fiber also acts as a protection preventing deterioration of the fiber due to moisture and atmospheric contaminants. In addition, the polymer protects the fiber from damage when a subsequent mechanical strength member is added.

A suitable polymer layer may also be interposed between the billet core and cladding. I have found that this prevents mixing of core and cladding halides during the extrusion process, resulting in a remarkably sharp and well-defined core boundary in the extruded fiber. The preferred radial thickness of this polymer layer is between about 0.03 mm and about 0.06 mm.

I have found that the quenching step immediately after extrusion results in a fine grain structure in the polycrystalline halide fiber. In the above process, the elimination of scratches or cracks on the fiber surface and the production of a fine grain provides minimum tansmission losses and maximum strength in the fiber.

To facilitate the use of the fiber, I prefer to form a cable by encasing the polymer-coated cladded fiber in a concentric strength member of Teflon (a trademark of E. I. DuPont de Nemours of Wilmington, DE) tetrafluoroethylene polymer, or the like, with a radial thickness ranging from about 0.1 to about 0.5 mm. The strength member may be a tight-fitting tube of Teflon or the like, or may be formed as a sheath around the fiber by direct co-extrusion onto the polymer-coated fiber, by dipping, or by other suitable means of application.

Alternatively, the fiber is placed coaxially in a loose-fitting tube of the strength member material. The space between the fiber and the strength member can then be completely filled with a liquid epoxy which cures to a high viscosity. The epoxy thus cushions the optical fiber and serves to limit the radius of curvature of the fiber to a safe value.

A window, transparent to IR, is disposed at the end of the cable which seals the end of the fiber from the atmosphere. The opposite end of the cable may have an attached connector for connecting such opposite end to the output of a laser with or without an IR window.

It may also be noted that my polymer coating is advantageous when poisonous halides are utilized as IR fibers to prevent pollution of the environment or danger in handling.

It is therefore a principal object of my invention to provide a method for manufacture of cladded infrared optical fibers having a protective polymer coating.

It is yet a further object of my invention to provide an infrared optical fiber having a core material of a first refractive index and a coaxial cladding of a second refractive index and in which the outside surface of the cladding is protected by a thin plastic or other polymer coating.

It is another object of my invention to provide cladded infrared optical fibers having a fine grain structure and a highly finished surface.

It is still another object of my invention to provide a method of extruding cladded infrared optical fibers from a preformed billet of halide material of a first refractive index and a sleeve of halide material of a second refractive index, the billet having a wrapping of a polymer plastic or the like in which the polymer acts as a lubricant during the extrusion process and in which the extruded fibers have a thin coating of the polymer.

It is a further object of my invention to provide an extrusion method for extruding cladded infrared optical fibers from halide compounds in which a billet is heated prior to extrusion and which is immediately cooled after extrusion for minimizing grain structure.

It is another object of my invention to provide cladded optical fibers for transmission of infrared energy in which the fiber is protected from mechanical damage and from deteriorating effects of the atmosphere, as well as to protect the environment from contamination in some instances.

It is another object of my invention to provide cladded IR transmission cables having a flexible IR optical fiber with a polymer protective coating wherein the fiber is disposed concentrically in an outer strength member of Teflon or other like polymer material.

It is another object of my invention to provide cladded IR transmission cables having a flexible IR optical fiber with a polymer protective coating wherein the fiber is disposed concentrically in a flexible strength member with the space between the optical fiber and the strength member being completely filled with a viscous epoxy or the like for providing cushioning to the optical fiber and limitation of the radius of curvature of the fiber.

It is another object of my invention to provide an IR energy transmission cable as described above in which the distal end includes an infrared window adapted to seal the end of the optical fiber for protection from moisture and other atmospheric contaminants.

It is another object of my invention to provide an IR energy transmission cable as described above in which the proximal end thereof has a connector for connecting to the output of a laser.

It is another object of my invention to provide an IR energy transmission cable as described above in which the space between the fiber and the strength member is completely filled with a rigid epoxy or the like.

These and further objects and advantages of my invention will become apparent from the following detailed description and the drawings.

DETAILED DESCRIPTION OF THE INVENTION

Figures 1, 2, 3, 4, 5, 6:
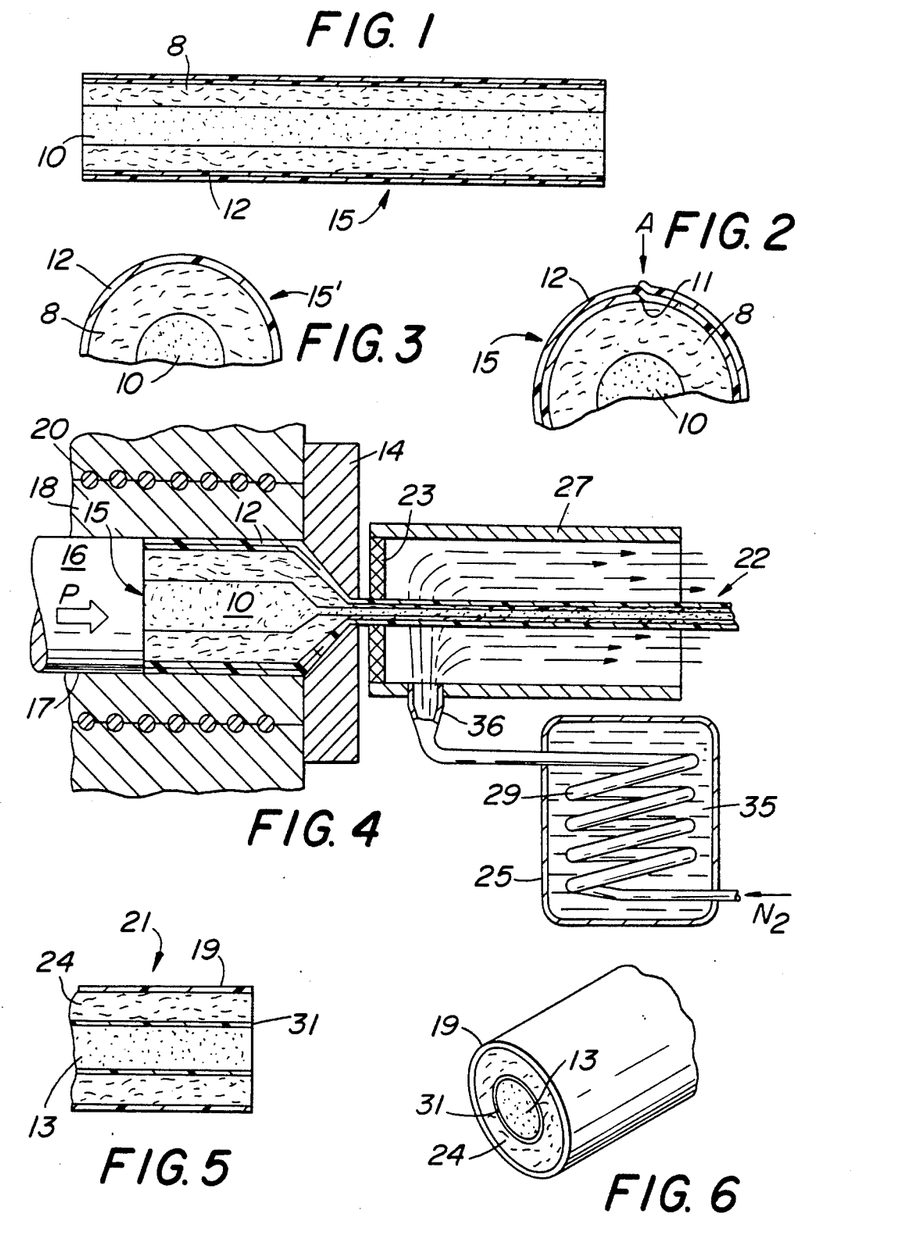
FIG. 1 is a longitudinal sectional view of a composite billet for the extrusion of a cladded fiber having a core, a cladding layer and an outer wrapping of polymer.
FIG. 2 is a partial cross-sectional view of a billet as in FIG. 1 showing a method of wrapping polymer to eliminate voids.
FIG. 3 is a partial cross-sectional view of a billet as in FIG. 1 wherein the outer polymer layer has been heat-shrunk into place, as an alternative to wrapping.
FIG. 4 is a longitudinal sectional view of a portion of an extrusion tool for producing an extruded polymer-coated fiber from a billet of the type shown in FIG. 1 in accordance with my invention.
FIG. 5 is a partial longitudinal sectional view of a billet for the extrusion of a cladded fiber having a core, a thin polymer layer surrounded by a cladding layer, and an outer polymer coating.
FIG. 6 is an end view of a fiber extruded from the billet of FIG. 5.

Referring to FIG. 1, a longitudinal sectional view of a cylindrical billet 15 in accordance with my method for fabricating an infrared optical fiber is shown. Although the dimensions of the billet are not critical, I prefer to use a cylindrical preform about 3–12 mm in diameter by about 80–100 mm in length. The material forming billet core 10 may be thallium halide, an alkali halide, or a silver salt, and is preferably between about 3 mm and about 6 mm in diameter before extrusion. To produce a fiber which will conduct elelctromagnetic energy falling within the infrared portion of the spectrum, various combinations of metal cations and anions may be utilized.

Very useful and widely used materials are the thallium halides in which thallium serves as the cation and bromine, chlorine, and iodine serve as the anions, either individually or in combinations. Thallium bromo-iodide, known commerically as KRS-5, is a popular material for IR fibers. Thallium bromo-iodo chloride, known commercially as KRS-6, is also an effective material.

Alkali halides are suitable materials in which the cation may be lithium, sodium, potassium, rubidium, or cesium with chlorine, bromine, iodine, or fluorine useful as the anion. Of the possible combinations, sodium and potassium are the most widely used cations with chlorine and bromine the most popular anions. Similarly, chlorine, bromine and iodine may supply anions to silver to produce useful silver salts.

I prefer the following cations: sodium, potassium, cesium, silver and thallium. I prefer the following anions: flourine, chlorine, bromine and iodine.

The preferred halides includes: NaCl, KCl, AgCl, TlCl, KBr, AgBr, TlBr, CsI, CsBr, KRS-5, and KRS-6.

Billet core 10 is surrounded by coaxial sleeve 8 which forms the cladding layer in the extruded fiber. Coaxial sleeve 8 preferably has a radial thickness of between about 1 mm and about 3 mm. The material forming sleeve 8 may be thallium halide, an alkali halide, or a silver salt, but must be selected so as to have a lower index of refraction than the material forming the billet core.

In preparing a billet 15 as in FIG. 1, I prefer the use of Merck's Optipur grade or other pure grade raw materials for both billet core and sleeve which have a very low concentration of impurities. The halide material can be obtained as a powder or in the form of a preform billet.

The halide powder is vacuum baked in a quartz ampoule to remove impurities, and then melted.

Normally, when the powdered material is melted, it solidifies as the polycrystalline form of the material. However, a Bridgeman growth process may be used to generate a single large crystal in the anion environment and thereby obtain a highly purified single crystalline ingot. P. W. Bridgeman, Proc. Am. Acad. Arts & Sci., 60, 305 (October 1925). The ingot is then machined, core drilled or extruded to obtain a suitable billet core 10.

Sleeve 8 is prepared in the same manner as billet core 10. The sleeve 8 is further core-drilled to accept billet core 10, which is inserted therein.

The billet core 10 of the prepared material should be inspected to determine that the side surfaces are perfectly smooth with no cracks, voids, or scratches. The side surfaces of sleeve 8 should be inspected, and polished if necessary.

The billet assembled from core 10 and sleeve 8 is wrapped with a plastic or other polymer film material to form a polymer layer 12. The final billet is identified generally by 15. The polymer may be polyethylene, mylar, Teflon, polyamide, polyvinyl fluoride, polyvinylidene chloride (saran), a cellulose material such as cellophane, or other available polymer film having the properties hereinafter set forth. Non-hygroscopic materials are preferred. In selecting the polymer film, it is preferable to select a film that will be ductile in the range of extrusion temperatures used for extruding billet core 10 and sleeve 8. The film must be ductile enough in comparison to the core and sleeve materials to maintain the proper extrusion ratio. The melting point of the film must be above the extrusion temperature of the billet. The film must be ductile at the extrusion temperature of the billet.

The amount of polymer film 12 covering the billet is not critical. A wrapping radial thickness of 0.03–0.09 mm may be used. Of greater importance than wrapping radial thickness is ensuring that there are no air pockets between the polymer film and the sleeve 8. Referring to FIG. 2, a typical wrapping procedure is illustrated. Here, polymer film 12 is wrapped twice around sleeve 8 to form two complete turns. The joint formed at the points of overlapping of the film ends may tend to produce small air pockets along the line shown at point 11. To overcome this problem, a small tool such as a soldering iron, burnishing tool, or the like may be used to apply heat and/or pressure indicated by arrow A along the seam at point 11 to force any entrapped air out at the ends of the billet 15. The wrapping operation must also be performed in a very clean, dust free environment since fine dust particles or the like on the surface of sleeve 8 may result in damage to the outer surface of the resulting fiber which will increase scattering losses in the final fiber.

As an alternative to wrapping the polymer material 12 around the assembled billet, the billet may be inserted into a cylindrical tube of the polymer which is heat shrunk around the billet. This technique prevents voids occurring between film 12 and the billet, as well as providing a more uniform coating. FIG. 3 shows a cross-sectional view of a billet 15' prepared in this fashion.

To extrude a core-clad-polymer fiber in accordance with my invention, a billet 15 is inserted in bore 17 and ram 16 is installed as shown in FIG. 4. The heater 20 is then energized. When block 18 is at the selected operating temperature, pressure P is applied to ram 16 by a suitable means not shown, such as motor driven screw or a hydraulic cylinder. The pre-selected temperature should be sufficient to cause material 10 and polymer 12 to become ductile. The pressure from ram 16 on billet 15 will cause coated fiber 22 to be extruded from die 14. I use a diamond wire die. As fiber 22 issues from die 14, it will, of course, be at the extrusion temperature. I have determined experimentally that a rapid quenching or cooling of the fiber 22 will significantly reduce the final grain size. To this end, I provide a tube 27 having a heat barrier 23 at its input end. As may be noted from the drawing, fiber 22 extends through a central opening in heat barrier 23. A source of nitrogen gas $N_2$ delivers the gas to cooling tube 29 which is immersed in a container 25 of liquid nitrogen 35 which is at a temperature of about 79° K. (−194° C.) or less. The nitrogen gas will flow through inlet 36, as indicated by the flow arrows, and will quickly chill the extruded fiber 22, greatly reducing the grain size. Heat barrier 23 prevents the cooling gas from affecting the material in the die during the extrusion process.

In some materials, stresses are induced during high pressure extrusion which cause increased losses, and thus aging. By exposing the fiber to an annealing process, those stresses are relieved and the initial low loss characteristics are maintained. Therefore, I have provided a tempering chamber (not shown) containing heating elements to relieve the stresses in the fiber 22.

Advantageously, I have found that the above-described extrusion process results in a very fine grain cladded halide fiber of higher tensile strength having a tight-fitting polymer external coating in which the surface area of the fiber is extremely smooth with few microfractures, scratches, or voids therein. In contrast to the extrusion of KRS-5 as taught by the prior art which produdes a minimum grain size of 3-4 microns, I achieve a grain size of about 1 micron in my plastic-coated cladded fiber 22.

In extruding cladded fibers of the alkali halides, temperatures between about 120° C. and about 350° C. may be used, with pressures ranging between about 25,000 psi and about 50,000 psi. It is believed that extrusion temperatures as low as room temperature may be used. I have found that the optimum extrusion temperature is 170° C.±20°, at a pressure of approximately 30,000 psi. The quenching step does not appear to be necessary with the alkali halides. Although the alkali halides are known to be highly hygroscopic and more brittle than the thallium halides, my plastic-coated alkali halide fibers have been exposed to humid environments with little deterioration in their optical characteristics being noted. In addition, no power damage threshold has been as yet determined, the fibers withstanding 25 kilowatts per square centimeter, the limit of my available test equipment. The polymer coating 12 counteracts the hygroscopicity of these fibers.

Harrington reports in Reference 8 a power damage threshold for unclad KRS-5 fibers extruded at 200°-350° C. of 6.1 KW/cm$^2$, with a transmission loss of 0.4 dB/m at 10.6 microns, or an absorption loss of $9.2 \times 10^{-4}$ cm$^{-1}$. Thus, it is believed that cladded thalium halide fibers may be extruded with a polymer coating according to the present invention using the same temperatures.

Chen et al in Reference 1 report room temperature extrusion of unclad silver halide fibers. It is believed that cladded silver halide polymer-coated fibers may be extruded at or near room temperature according to the present invention. The rate of extrusion for fine grain fiber can be expected to be in excess of 2 meters per hour.

Ideally, extrusion for all fibers according to the present invention is performed at room temperature. In the prior art, it has been found that extruding at lower temperatures will produce a finer grain structure. However, some halides are not extrudable at room temperature because of a lack of ductility or inordinate extrusion pressure requirements.

In FIG. 5, a partial longitudinal-sectional view of another cylindrical billet 21 in accordance with my method for fabricating an infrared optical fiber is shown. Billet 21 is similar to billet 15' (FIG. 3) but contains an additional inner polymer film layer 31 sandwiched at the interface between core 13 and sleeve 24. Sleeve 24 is comparable to coaxial sleeve 8 and may be thallium halide, an alkali halide or silver salt having a lower index of refraction than core 13. Inner film layer 31 is formed by inserting billet core 13 into a tube of appropriate polymer which is heat shrunk around the billet core. Alternately, billet core 13 may be wrapped with a polymer film prior to insertion into sleve 24.

As a further alternative, a suitable polymer-coated billet core may be prepared directly from an ingot of the core material, by coextruding the ingot and polymer. This will provide a thin uniform polymer film around the billet core 13.

Polymer film 19 is heat shrunk around the outer surface of sleeve 24 as in FIG. 3 to form an outer polymer coating. Alternatively, polymer film 19 may be formed by wrapping as in FIG. 2. Polymer film 19 in FIG. 5 should conform to the physical requirements of polymer film 12 in FIGS. 1-3, i.e., it should be nonhygroscopic and have a melting point above the extrusion temperature of the billet, and be ductile at the extrusion temperature of the billet. Polymer film 19 may have a radial thickness of between about 0.03 mm and about 0.09 mm.

Inner polymer film 31 ideally is optically transparent at the required wavelength. The thickness of polymer film 31 is determined by two opposing considerations. The film 31 should be sufficiently thick to prevent mixing of core and cladding during the extrusion process, yet at the same time it must not be so thick as to result in appreciable absorption of transmitted infrared radiation. Greater thicknesses of relatively low absorbing polymers such as cellophane can be tolerated, whereas the same thickness of a higher absorbing material would result in undesirable absorption. This polymer film 31 can be a thin absorbing material for applications of the fiber that do not require long lengths, such as laser surgery. Like the outer polymer film, the inner film 31 must be ductile at billet extrusion temperatures. Inner polymer film 31 may be selected from the same polymer materials useful for the outer polymer film 19. It is not necessary, however, that inner polymer film 31 be non-hygroscopic.

Billet 21 is extruded in the apparatus of FIG. 4 to produce the fiber shown in end view in FIG. 6. For optimum results, the composite billet is pre-compacted as follows. The billet core is preferably 1/16 inch shorter in length than the cladding sleeve. The composite billet is first placed in an extrusion press containing a blanked extrusion die, and the temperature is rapidly increased to about 200° C. for 1-2 minutes at about 20,000 psi. The blanked die is then replaced with an appropriate extrusion die, and the fiber is extruded at the appropriate temperature. The pre-compaction step results in a composite billet wherein the core and cladding sleeve are concentric with no gaps in polymer film 31.

Figure 7:
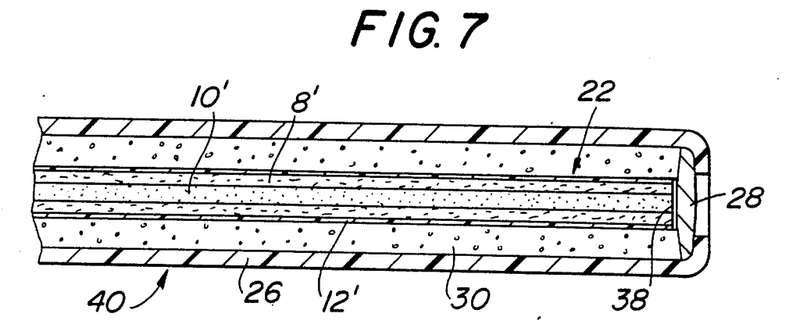
FIG. 7 is a longitudinal sectional view of an infrared energy transmission cable formed from a fiber extruded in accordance with my invention having a strength member, a viscous filling, and an infrared window.

Having described the novel process of my invention, the construction of an infrared optical cable or conduit utilizing my coated fibers will be described. Turning to FIG. 7, a longitudinal section of the distal end portion of the cable 40 is shown. An extruded fiber 22 having a polycrystalline core 10', cladding 8' and polymer coating 12' is shown in longitudinal section concentric with a strength member 26. Strength member 26 may be formed from Teflon tubing, thin-walled metal tubing, or other type of flexible tubing. The space between coated fiber 22 and the inside of strength member 26 is completely filled with an epoxy type material 30. Although many types of epoxy are available which will be suitable for various purposes, I prefer a member of Epoxy Technology Series 300 (Epoxy Technology, Inc.), such as Epoxy 310, which is prepared as a liquid and may be injected into the sheath 26 easily and permitted to cure. After curing, this epoxy is in a very viscous semi-solid form which permits the cable or conduit to be curved as required and cushions the suspended coated fiber 22 and provides additional mechanical damage protection. At the distal end of the cable, an IR window 28 may be installed and sealed therein. Window 28 may be zinc selenide, zinc sulfide, germanium, diamond, or other IR transparent materials depending upon the wavelength desired. Window 28 effectively seals the output end 38 of IR fiber 22 to prevent damage thereto, absorption of moisture or other contaminants. For toxic fibers, the window 28 also provides protection to the environment from the fiber. For some applications of the cable, such as thermal sensing the window may be dispensed with.

Figure 8:
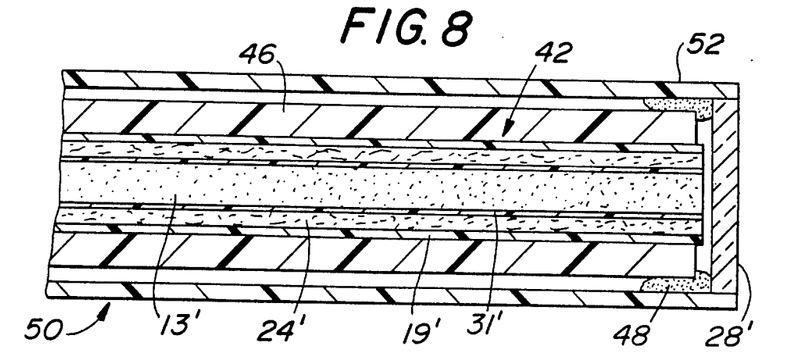
FIG. 8 is a longitudinal sectional view of an infrared energy transmission cable formed from the fiber of FIG. 6 and having a strength member contacting the fiber without intervening viscous filling, an infrared window and an outer jacket.

FIG. 8 is a longitudinal section of the distal end of another cable embodiment 50. An extruded fiber 42, similar to the fiber shown in FIG. 6, and having a polycrystalline core 13', inner polymer film 31', cladding 24', and outer polymer film 19' is shown in longitudinal section, concentrically surrounded by strength member 46. Strength member 46 may be a tube of Teflon or other like polymer. Strength member 46 may also comprise a thin-walled metal tube. Strength member 46 is preferably formed around fiber 42 by a concentric extrusion process following extrusion of fiber 42. The material and thickness of strength member 46 can be altered to meet the requirements of the application. Considerations for determining material and thickness include, for example, flexibility requirements, minimum bend radius, and maximum outside diameter permissible in a particular application, i.e., the ability of the cable to fit into the available working space.

An IR window 28' similar to the window 28 in FIG. 7 may be attached to one end of strength member 46 by means of an adhesive 48, or by ultrasonic fusion or other conventional sealing techniques. The attachment means chosen is dependent on the material used for strength member 46 and the application.

Where short semi-rigid segments of cable are needed, cable 50 may be placed in a jacket 52 of metal or polymer tubing which may be filled with an approximate cushioning material. Window 28' may be held in place by jacket 52, as shown in FIG. 8. Metal tubing is appropriate in applications where the bend radius experienced by the cable is not so severe as to cause crimping of the tube. I have achieved a bend radius of less than 50 mm with a stainless steel tube of 1.24 mm outer diameter and radial wall thickness of 0.14 mm.

Figure 9:
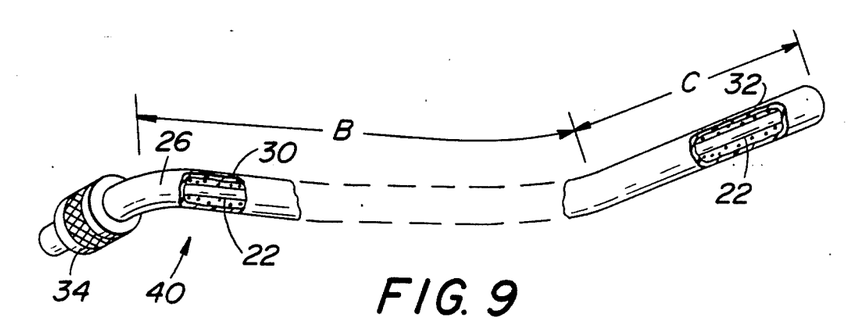
FIG. 9 is a partial and cutaway perspective view of an infrared energy transmission cable having a flexible section, a rigid section, and a connector.

A typical IR transmission cable 40 is shown in perspective view in FIG. 9 with portions cut away to show an alternative construction. A connector 34 is provided at the proximal end which may connect to the output of a $CO_2$ laser as an example. An Amphenol type 905-117-xxxx (Bunker Ramo) precision fiber optic connector or an Optical Fiber Technologies, Inc. OFTI200-S series fiber connector is well suited for this use. The connector may contain a window. The cable portion from plug 34 toward the distal end to a point indicated by B has the same construction as shown in FIG. 7, except for the absence of window 28. However, portion C of cable 40 between point B and the distal end may advantageously utilize a different filling material than the viscous epoxy 30 previously discussed. Filling material 32, which may also be an epoxy, is selected to cure to a rigid condition. Suitable rigid-curing materials include, for example, Epoxy 337; Tra-Bond (a trademark of Tra-Con, Inc.) F110 low viscosity adhesive or F230 low viscosity/high-temperature adhesive. Therefore, portion C of cable 40 may be rigid. This construction is useful where cable 40 is used for machining, for transmitting heat energy from the distal end for remote temperature measurements, or for surgery where a rigid segment is required. A cable, lacking the portion designated C, in which the viscous type filler 30 is used throughout, is useful for surgical applications where the conduit may be inserted into arteries, endoscopes or the like. Suitable flexible-curing materials in addition to Epoxy 310 include, for example, Silastic 732 RTV (Dow Corning) and Tra-Cast (a trademark of Tra-Con, Inc.) F311 which cures to semi-flexibility.

The length of cable 40 is, of course, selected as a function of the application, but may vary from a fraction of a meter to several meters in length. The diameter is also variable with the application. I have produced optical fibers in accordance with my invention having diameters from 0.4 mm to 1 mm. I expect to produce fibers having diameters ranging between 75 mirons to 2 mm. Thus, the outside diameter of cable 40 may be in the range of 0.1 mm to 3 mm. As may now be recognized, such cables may be fabricated which are insertable through passages in available medical instruments such as endoscopes, cystoscopes, and other similar instruments. Thus, the fiber of my invention can be used in conjunction with presently available instruments which have optical fibers or other light conduit means in the visible light range for illumination and viewing of the operative portion of the instrument.

The invention will now be described in greater detail with reference to the following non-limiting examples.

EXAMPLE 1

KBr/KCl Core-Clad-Polymer Fiber

A three-part cylindrical preform billet was prepared having a 3 mm diameter KBr core (n=1.52) and a 6 mm outer diameter KCl sleeve (n=1.45). Saran was wrapped around the sleeve to a thickness of 0.076 mm. Extrusion was carried out at about 180° C. and 33,000 psi to form a cladded fiber of 0.6 mm outside diameter.

EXAMPLE 2

NaKl/KCl Core-Clad-Polymer Fiber

A three-part cylindrical preform billet was prepared having a 3 mm diameter NaCl core (n=1.49) and a 6 mm outer diameter KCl sleeve (n=1.45). Saran was wrapped around the sleeve as in Example 1 to a thickness of 0.076 mm. Extrusion was carried out at approximately 220° C. and approximately 30,000 psi to form a fiber of 0.6 mm outside diameter.

EXAMPLE 3

KBr/KCl Core-Polymer-Clad-Polymer Fiber

A four-part cylindrical preform billet was prepared having a 3 mm diameter KBr core and 6 mm outer diameter KCl sleeve between which was sandwiched a layer of 0.038 mm thickness saran wrapped to a thickness of between about 0.038 to about 0.076 mm. Saran was also wrapped around the sleeve as in Example 1 to a thickness of 0.076 mm. Extrusion was carried out at approximately 200° C. and approximately 30,000 psi to form a fiber of 0.6 mm outside diameter.

Other possible combinations of halides useful for core and cladding materials in both core-polymer-clad-polymer or core-clad-polymer fibers are set forth in Table I. Pairing of core and cladding halides is dictated by melting point and index of refraction. The core halide must have an index of refraction greater than the clad halide. Core and clad halides should melt at roughly similar temperatures.

TABLE I

| CORE | | | CLAD | | | |
|---|---|---|---|---|---|---|
| HAL-IDE | n | MELTING POINT (°C.) | HALIDE | n | MELTING POINT (°C.) | Δn |
| AgBr | 2.00 | 432 | AgCl | 1.98 | 455 | 0.02 |
| CsBr | 1.66 | 636 | KCl | 1.45 | 790 | 0.21 |
| CsI | 1.74 | 621 | CsBr | 1.66 | 636 | 0.08 |
| KRS-5 | 2.37 | 414 | TlBr | 2.34 | 460 | 0.03 |

Other combinations of halides are possible, yielding fibers having properties similar to fibers formed from the combinations of halides listed above. Properties of the resulting fiber which will vary according to the choice of halide include: flexibility, transmission bandwidth, cost, toxicity, melting point, etc. Where flexibility is desired, softer halide materials may be used. Transmission bandwidths (in microns) are reported in the literature. Examples for certain core materials are as follows: AgBr, 0.5–25 microns; CsBr, 0.25–35 microns; KRS-5, 2–40 microns. Where fibers are used in high-power applications, or in areas of high temperatures, e.g. laser surgery, high melting point materials are desireable.

Although I have described my invention with reference to the preferred embodiment, many variations will be apparent to those of skill in the art. Optical fibers are traditionally circular in cross-section. However, other cross-sectional forms may be useful in specific applications. Accordingly, the billet used to extrude the fibers and the extrusion die opening may be rectangular, hexagonal or other special shape. Such variations are to be considered within the scope and spirit of my invention.

The steps necessary to practice my invention may be summarized as follows:
1. Forming a two-part billet of halide compounds;
2. Covering the billet with a polymer film;
3. Bringing the billet to a temperature at which the billet and polymer film become ductile; and
4. Extruding the billet through a die.

For certain of the halide compounds, an improvement in grain size is achieved by the additional step of rapidly cooling the extruded fiber as it issues from the die.

The steps in forming the billet may also advantageously include:

5. Baking a halide powder in a vacuum to remove impurities;
6. Melting the powder in a vacuum to form an ingot;
7. Machining or extruding an ingot to form the billet core; and
8. Machining or extruding a second ingot to form a sleeve member and core drilling the second ingot to accept the core.
9. Polishing the core and sleeve to remove scratches or other surface irregularities.
10. Assembling the billet by inserting the core into the sleeve.

In the following claims, where reference is made to a polymer film, it is intended that such polymer film have the properties of the polymer films heretofore set forth.

The present invention may be embodied in other specific forms without departing from the spirit or essential attributes thereof and, accordingly, reference should be made to the appended claims, rather than to the foregoing specification, as indicating the scope of the invention.

I claim:

1. The process of fabricating a low loss cladded halide fiber waveguide for transmission of infrared frequencies comprising the steps of:

forming a first ingot of a first halide compound having a first index of refraction;

forming a second ingot of a second halide compound having an index of refraction less than the first index of refraction;

forming a cylindrical billet core from the first ingot;

forming a sleeve cladding for the cylindrical billet core from the second ingot;

inserting the core coaxially in the sleeve cladding to form a composite billet;

coaxially covering the composite billet with a non-hygroscopic polymer film;

heating the composite billet having an outer non-hygroscopic polymer film to a temperature that renders the halide compounds and the polymer ductile; and extruding the heated composite billet having said non-hygroscopic polymer film through a die to form a cladded fiber having a protective outer polymer coating.

2. A process according to claim 1 which includes the further step of rapidly cooling the extruded fiber.

3. A process according to claim 2 which includes the further step of annealing the cooled fiber.

4. A process according to claim 1 wherein the first and second halides are formed from a cation selected from the group consisting of sodium, potassium, cesium, silver and thallium, and an anion selected from the group consisting of fluorine, chlorine, bromine and iodine.

5. The process according to claim 1 wherein the first and second halides are selected from the group consisting of potassium chloride, potassium bromide, sodium chloride, thallium bromide, thallium chloride, thallium bromo-iodide, thallium bromo-iodo chloride, cesium iodide, cesium bromide, silver bromide and silver chloride.

6. The process according to claim 1 wherein before extrusion the core diameter is between about 3 mm and about 6 mm, the sleeve cladding radial thickness is between about 1 mm and about 3 mm, and the polymer film radial thickness is between about 0.03 mm and about 0.09 mm.

7. The process according to claim 6 wherein the composite billet is extruded to an outside diameter of between about 0.075 mm and about 2.0 mm.

8. The process according to claim 1 in which the step of forming each ingot includes the steps of:
   baking a powder of the halide compound to remove impurities therefrom;
   melting the halide compound; and
   growing a single halide crystal from the halide compound to form an ingot.

9. The process according to claim 8 in which the steps of baking and melting are performed in a vacuum environment.

10. The process according to claim 8 in which the ingot-forming step includes the step of polishing the outer surface of ingots.

11. The process according to claim 1 wherein the non-hygroscopic polymer film is selected from the group consisting of mylar, polyethylene, polyvinyl fluoride, polyvinylidene chloride, nylon, tetrafluoroethylene polymer and cellophane.

12. The process according to claim 1 which includes the further step of disposing the fiber coaxially in a strength member.

13. The process according to claim 12 wherein the strength member is formed by extrusion around the fiber.

14. The process according to claidm 12 wherein the strength member is formed by dipping the fiber in the material comprising the strength member.

15. The process according to claim 12 which includes the further steps of:
   installing an infrared window at one end of the strength member; and
   installing a connector at the other end of the strength member.

16. The process according to claim 15 wherein the connector contains an infrared window.

17. The process of fabricating a low loss cladded halide fiber waveguide for transmission of infrared frequencies comprising the steps of:

forming a first ingot of a first halide compound having a first index of refraction;

forming a second ingot of a second halide compound having an index of refraction less than the first index of refraction;

forming a polymer-coated cylindrical billet core from the first ingot, said polymer coating comprising a first polymer film means for segregating said first and second halides during extrusion, said polymer means having a radial thickness so that segregation is achieved without appreciable absorption at infrared frequencies;

forming a sleeve cladding for the cylindrical billet core from the second ingot;

inserting the polymer-coated core coaxially in the sleeve cladding to form a composite billet;

heating the composite billet to a temperature that renders the halide compounds and the polymer film ductile; and extruding the heated composite billet through a die to form a cladded fiber.

18. The process according to claim 17 wherein the step of forming the polymer-coated cylindrical billet core comprises coextruding said first ingot and said first polymer film.

19. The process according to claim 17 which includes the further step of rapidly cooling the extruded fiber.

20. The process according to claim 17 wherein the first and second halides are selected from the group consisting of potassium chloride, potassium bromide, sodium chloride, thallium bromide, thallium chloride, thallium bromo-iodide, thallium bromo-iodo chloride, cesium bromide, cesium iodide, silver bromide and silver chloride.

21. The process according to claim 17 which includes the further step of coaxially covering the composite billet with a second non-hygroscopic polymer film to form a cladded fiber having a protective outer polymer coating.

22. The process according to claim 21 wherein before extrusion the core diameter is between about 3 mm and about 6 mm, the sleeve cladding radial thickness is between about 1 mm and about 3 mm, the first polmer film radial thickness is between about 0.03 mm and about 0.06 mm, and the second polymer film radial thickness is between about 0.03 mm and about 0.09 mm.

23. The process according to claim 21 wherein the composite billet is extruded to an outside diameter of between about 0.075 mm an about 2.0 mm.

24. The process according to claim 21 which includes the further step of disposing the fiber coaxially in a strength member.

25. The process according to claim 24 wherein the strength member is formed by extrusion around the fiber.

26. The process according to claim 24 wherein the strength member is formed by dipping the fiber in the material comprising the strength member.

27. The process according to claim 24 which includes the steps of:
   disposing the fiber coaxially in a tube of the strength member having a coaxial space between the fiber and the inner surface of the tubing;
   filling the space with a liquid epoxy; and
   curing the epoxy to form a highly viscous semisolid compound for cushioning and protecting the fiber.

28. The process according to claim 27 which includes the further steps of:

installing an infrared window at one end of the strength member; and installing a connector at the other end of the strength member.

29. The process according to claim 17 wherein the first and second halides are selected from the group consisting of KCL, NaCl, NaBr and KBr, and extrusion is carried out at a temperature of between about room temperature and about 350° C.

30. The process according to claim 17 further including the step of pre-compacting the composite billet against a blanked extrusion die prior to extrusion.

31. The process of fabricating a low loss clad halide fiber waveguide for transmission of infrared frequencies comprising the steps of:

forming a first ingot of a first halide compound having a first index of refraction;

forming a second ingot of a second halide compound having an index of refraction less than the first index of refraction;

forming a cylindrical billet core from the first ingot;

forming a sleeve cladding for the cylindrical billet core from the second ingot;

inserting the core coaxially in the sleeve cladding to form a composite billet;

inserting the composite billet coaxially in a cylindrical tube of non-hygroscopic polymer film and heat shrinking said tube around the composite billet;

heating the composite billet to a temperature that renders the halide compounds and the polymer ductile; and extruding the heated composite billet through a die to form a clad fiber having a protective outer polymer coating.

32. The process of fabricating a low loss clad halide fiber waveguide for transmission of infrared frequencies comprising the steps of:

forming a first ingot of a first halide compound selected from the group consisting of DCl, NaCl, NaBr and KBr having a first index of refraction;

forming a second ingot of a second halide compound selected from the group consisting of KCl, NaCl, NaBr and KBr having a second index of refraction less than the first index of refraction;

forming a cylindrical billet core from the first ingot;

forming a sleeve cladding for the cylindrical billet core from the second ingot;

inserting the core coaxially in the sleeve cladding to form a composite billet;

coaxially covering the composite billet with a non-hygroscopic polymer film;

heating the composite billet to a temperature that renders the halide compounds and the polymer ductile; and extruding the heated composite billet through a die at a temperature of betwen about room temperature and about 350° C. to form a clad fiber having a protective outer polymer coating.

33. The process of fabricating a low loss clad halide fiber waveguide for transmission of infrared frequencies comprising the steps of:

forming a first ingot of a first halide compound having a first index of refraction;

forming a second ingot of a second halide compound having an index of refraction less than the first index of refraction;

forming a cylindrical billet core from the first ingot;

forming a sleeve cladding for the cylindrical billet core from the second ingot;

inserting the core coaxially in the sleeve cladding to form a composite billet;

coaxially covering the composite billet with a non-hygroscopic polymer film;

heating the composite billet to a temperature that renders the halide compounds and the polymer ductile;

extruding the heated composite billet through a die to form a clad fiber having a protective outer polymer coating; and disposing the fiber coaxially in a strength member by disposing the fiber coaxially in a tube of the strength member with a coaxial space between the fiber and the inner surface of the tubing, filling the space with a liquid epoxy, and curing the epoxy to form a highly viscous semi-solid compound for cushioning and protecting the fiber.

34. A cladded optical fiber for transmission of electromagnetic energy in the infrared region of the spectrum comprising:

an extrusion of a cylindrical core of a first halide compound having a first index of refraction;

a coaxial cladding layer disposed around said core of a second halide compound having a second index of refraction less than the first index of refraction; and a non-hygroscopic polymer film covering said cladding.

35. A cladded optical fiber according to claim 34 having a diameter between about 75 and about 2,000 microns.

36. A cladded optical fiber according to claim 34 wherein the first and second halides are selected from the group consisting of potassium chloride, potassium bromide, sodium chloride, thallium bromide, thallium chloride, thallium bromo-iodide, thallium bromo-iodo chloride, cesium bromide, cesium iodide, silver bromide and silver chloride.

37. A cladded optical fiber according to claim 34 wherein the non-hygroscopic polymer film is selected from the group consisting of mylar, polyethylene, polyvinyl fluoride, polyvinylidene chloride, nylon, teflon and cellophane.

38. A cladded optical fiber according to claim 34 having a non-hygroscopic polymer film intermediate the cylindrical core and the coaxial cladding layer.

39. A cladded optical fiber for transmission of electromagnetic energy in the infrared region of the spectrum comprising:

a cylindrical core formed from a first halide compound having a first index of refraction:

a coaxial cladding layer disposed around said core formed from a second halide compound having a second index of refraction less than the first index of refraction;

a first polymer film means coaxially disposed intermediate the cylindrical core and the coaxial cladding layer, said first film means having a radial thickness less than the thickness which causes appreciable energy absorption at infrared frequencies.

40. A cladded optical fiber according to claim 39 having a second non-hygroscopic polymer film means providing a continuous intimate covering around said cladding layer.

41. A cable for transmission of electromagnetic energy in the infrared portion of the spectrum comprising:

an extrusion of a cladded optical fiber having a cylindrical core formed from a first halide compound having a first index of refraction, a coaxial cladding layer disposed around said core of a second halide compound having a second index of refraction less than the first index of refraction, and a non-hygroscopic polymer film covering said fiber; and a polymer strength member coaxially disposed around said extrusion.

42. A cable according to claim 41 wherein the strength member is in intimate contact with the fiber.

43. A cable according to claim 42 wherein the strength member is formed by extrusion around the fiber.

44. A cable according to claim 42 wherein the strength member is formed by dipping the fiber in the material comprising the strength member.

45. A cable according to claim 41, which further comprises a jacket means coaxially disposed around the strength member.

46. A cable according to claim 41 which further comprises:

a window transparent to infrared energy disposed at the distal end of said cable; and a connector disposed at the proximal end of said cable for connecting to a source of infrared energy.

47. A cable according to claim 46 wherein the connector contains a window transparent to infrared energy.

48. A cable for transmission of electromagnetic energy in the infrared portion of the spectrum comprising:

an extrusion of a cladded optical fiber having a cylindrical core of a first halide compound having a first index of refraction;

a coaxial cladding layer disposed around said core of a second halide compound having a second index of refraction less than the first index of refraction;

a first polymer film coaxially disposed intermediate the cylindrical core and the coaxial cladding layer, said first polymer film having a radial thickness less than the thickness which causes appreciable energy absorption at infrared frequencies; and a strength member coaxially disposed around said extrusion.

49. A cable according to claim 48 having a second hygroscopic polymer film means providing a continuous intimate covering around said cladding layer.

50. A cable for transmission of electromagnetic energy in the infrared portion of the spectrum comprising:

an extrusion of a clad optical fiber having a cylindrical core formed from a first halide compound having a first index of refraction, a coaxial cladding layer disposed around said core of a second halide compound having a second index of refraction less than the first index of refraction, and a non-hygroscopic polymer film covering said fiber; and a polymer strength member coaxially disposed around said extrusion and containing a semi-solid viscous material in the coaxial space between the fiber and the inner surface of the strength member for cushioning and protecting said fiber.

51. A cable according to claim 50 in which a first portion of said coaxial space is filled with said viscous material and a second portion of said space is filled with a rigid material.

52. A cable according to claim 50 wherein said semi-solid viscous material is an epoxoy compound.

53. A cable for transmission of electromagnetic energy in the infrared portion of the spectrum comprising:

an extrusion of a clad optical fiber having a cylindrical core formed from a first halide compound having a first index of refraction, a coaxial cladding layer disposed around said core of a second halide compound having a second index of refraction less than the first index of refraction, a non-hygroscopic film intermediate the cylindrical core and the coaxial cladding layer, a non-hygroscopic polymer film covering said fiber; and a polymer strength member coaxially disposed around said extrusion.

* * * * *

UNITED STATES PATENT AND TRADEMARK OFFICE
CERTIFICATE OF CORRECTION

PATENT NO. : 4,678,274
DATED : July 7, 1987
INVENTOR(S) : Terry A. Fuller

It is certified that error appears in the above-identified patent and that said Letters Patent is hereby corrected as shown below:

Column 1, line 9, change "protectice" to --protective--
Column 1, line 67, change "SKogman to --Skogman--
Column 4, line 60, change "bittlet" to --billet--
Column 4, line 64, change "Chenmical" to --Chemical--
Column 5, line 56, change "tansmission" to --transmission--
Column 10, line 47, change "sleve" to --sleeve--
Column 13, line 20, change "NaKl/KCl" to --NaCl/KCl--
Column 16, line 43, change "polmer" to --polymer--
Column 17, line 39, change "DCl" to --KCl--
Column 17, line 56, change "betwen" to --between--

Signed and Sealed this

Eighth Day of March, 1988

*Attest:*

DONALD J. QUIGG

*Attesting Officer*   *Commissioner of Patents and Trademarks*